(12) United States Patent
Nanjo (10) Patent No.: US 9,351,410 B2
(45) Date of Patent: May 24, 2016

(54) ELECTRONIC COMPONENT BUILT-IN MULTI-LAYER WIRING BOARD AND METHOD OF MANUFACTURING THE SAME

(71) Applicant: FUJIKURA LTD., Tokyo (JP)

(72) Inventor: Hirokazu Nanjo, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/201,166

(22) Filed: Mar. 7, 2014

(65) Prior Publication Data
US 2015/0257273 A1    Sep. 10, 2015

(51) Int. Cl.
| | |
|---|---|
| *H05K 1/16* | (2006.01) |
| *H05K 1/18* | (2006.01) |
| *H05K 1/14* | (2006.01) |
| *H05K 3/46* | (2006.01) |
| *H01L 23/538* | (2006.01) |

(Continued)

(52) U.S. Cl.
CPC ............ *H05K 3/4694* (2013.01); *H01L 21/486* (2013.01); *H01L 23/5383* (2013.01); *H01L 23/5385* (2013.01); *H01L 23/5389* (2013.01); *H01L 24/19* (2013.01); *H01L 24/97* (2013.01); *H05K 1/185* (2013.01); *H05K 3/4617* (2013.01); *H01L 24/32* (2013.01); *H01L 24/73* (2013.01); *H01L 24/83* (2013.01); *H01L 2224/04105* (2013.01); *H01L 2224/32225* (2013.01); *H01L 2224/73267* (2013.01); *H01L 2224/83192* (2013.01); *H01L 2224/97* (2013.01);

(Continued)

(58) Field of Classification Search
CPC ... H05K 1/0298; H05K 3/4679; H05K 3/306; H05K 1/115; H05K 1/144; H05K 1/142; H05K 1/185; H05K 1/145; H05K 3/18; H05K 3/182; H05K 1/183; H05K 2201/048; H05K 1/182; H05K 3/36; H05K 3/4617; H05K 3/4694; H01L 21/486; H01L 23/5389; H01L 23/5383; H01L 23/5385; H01L 24/19; H01L 24/97; H01L 24/83; H01L 2924/14; H01L 2224/97; H01L 2224/83192; Y10T 29/49126
USPC .................. 174/250–268; 361/760, 792–795
See application file for complete search history.

(56) References Cited

U.S. PATENT DOCUMENTS 8,072,769 B2 * 12/2011 Ieki et al. ........................ 361/761
8,431,829 B2 *  4/2013 Takahashi ..................... 174/255

(Continued)

FOREIGN PATENT DOCUMENTS

JP    2001-119148 A    4/2001
JP    2006-73763 A     3/2006

(Continued)

*Primary Examiner* — Ishwarbhai B Patel
(74) *Attorney, Agent, or Firm* — Westerman, Hattori, Daniels & Adrian, LLP (57) ABSTRACT

An electronic component built-in multi-layer wiring board that is configured by collectively stacking a plurality of printed wiring boards therein by thermal compression bonding and that has a plurality of electronic components built in thereto, wherein the electronic components include a first electronic component and a second electronic component having a thickness which is greater than that of the first electronic component, the first electronic component is built in to an embedding-dedicated board set to a thickness which is 80% to 125% of the thickness of the second electronic component, and the embedding-dedicated board and the second electronic component are then mounted on the printed wiring board and thereby built in to the electronic component built-in multi-layer wiring board, and the embedding-dedicated board is formed by an identical material to that of the printed wiring board.

4 Claims, 4 Drawing Sheets

(51) Int. Cl.
*H01L 23/00* (2006.01)
*H01L 21/48* (2006.01)

(52) U.S. Cl.
CPC .............. *H01L2924/14* (2013.01); *H05K 1/14* (2013.01); *H05K 1/141* (2013.01); *H05K 2201/048* (2013.01); *Y10T 29/49126* (2015.01)

(56) References Cited

U.S. PATENT DOCUMENTS

2006/0042078 A1 3/2006 Takeuchi et al.
2009/0283312 A1 11/2009 Takahashi
2013/0003314 A1 1/2013 Igarashi et al.

FOREIGN PATENT DOCUMENTS

| JP | 2009-289802 A | 12/2009 |
| JP | 2013-183015 A | 9/2013 |
| JP | 5406322 B2 | 2/2014 |
| WO | 2009/141928 A1 | 11/2009 |
| WO | 2011/102561 A1 | 8/2011 |

\* cited by examiner

FIG. 6I

ELECTRONIC COMPONENT BUILT-IN MULTI-LAYER WIRING BOARD AND METHOD OF MANUFACTURING THE SAME

STATEMENT REGARDING PRIOR DISCLOSURES BY THE INVENTOR OR A JOINT INVENTOR UNDER 37 C.F.R. 1.77(b)(6)

Japanese Patent No. P5406322 was published on Nov. 8, 2013. The inventor of the Japanese Patent No. P5406322 is Hirokazu NANJON who is the inventor of the present application. The applicant, Fujikura Ltd., of the Japanese Patent No. P5406322 is an assignee who obtained the invention of the Japanese Patent from the present inventor. A copy of the Japanese Patent is provided on a concurrently filed Information Disclosure Statement pursuant to the guidance of 78 Fed. Reg. 11076 (Feb. 14, 2013).

BACKGROUND OF THE INVENTION

1. Field of the Invention

This invention relates to an electronic component built-in multi-layer wiring board having an electronic component built in thereto, and a method of manufacturing the same.

2. Description of the Prior Art

A known conventional multi-layer wiring board having an electronic component such as a semiconductor element, or the like, built in between layers thereof is, for example, an IC chip built-in multi-layer board disclosed in Japanese Unexamined Patent Application Publication No. 2001-119148 A described below. This IC chip built-in multi-layer board comprises: an IC chip mounting board on which the IC chip is mounted so as to embed the IC chip; a prepreg provided on an IC chip embedding surface side; an outer layer-dedicated printed wiring board provided on a non-embedding surface side; and an inner layer wiring board sandwiched by the prepreg.

Moreover, in the IC chip mounting board, due to the fact that during chip embedding, an IC chip of a certain thickness is polished so as to be aligned with a thickness of the mounting board and is thereby built in by aligning the thickness of the IC chip with that of the mounting board, IC chips of different thicknesses are built in in a multi-layer structure. In this way, thinning of a circuit board and simplification of a manufacturing method are attempted.

However, in the IC chip built-in multi-layer board of conventional technology disclosed in above-described Japanese Unexamined Patent Application Publication No. 2001-119148 A, there is a problem that thicknesses of various kinds of electronic components built in are different, hence a complicated stacking process for adjusting these different thicknesses is required, whereby it is difficult to manufacture the IC chip built-in multi-layer board more simply.

SUMMARY OF THE INVENTION

This invention has an object of overcoming the above-mentioned problems due to conventional technology to provide an electronic component built-in multi-layer wiring board capable of having a plurality of electronic components of different thicknesses built in thereto by a simple method, and a method of manufacturing the electronic component built-in multi-layer wiring board.

An electronic component built-in multi-layer wiring board according to an embodiment of the present invention, the electronic component built-in multi-layer wiring board being configured by collectively stacking a plurality of printed wiring boards therein by thermal compression bonding and the electronic component built-in multi-layer wiring board having a plurality of electronic components built in thereto, wherein the electronic components include a first electronic component and a second electronic component having a thickness which is greater than that of the first electronic component, the first electronic component is built in to an embedding-dedicated board set to a thickness which is 80% to 125% of the thickness of the second electronic component, and the embedding-dedicated board and the second electronic component are then mounted on the same printed wiring board and thereby built in to the electronic component built-in multi-layer wiring board, and the embedding-dedicated board is formed by an identical material to that of the printed wiring board.

The electronic component built-in multi-layer wiring board according to the embodiment of the present invention results in the following, namely that: a first electronic component is built in to an embedding-dedicated board set to a thickness which is 80% to 125% of a thickness of a second electronic component; and these are then mounted on the same printed wiring board to be built in to the electronic component built-in multi-layer wiring board. Hence, there is no need to design accounting for different cavities, moreover mounting processes of the electronic components can also be standardized, thereby making it possible for the electronic component built-in multi-layer wiring board to be manufactured simply.

In addition, the embedding-dedicated board and the printed wiring board are formed by an identical material, hence there is also no occurrence of trouble such as strain resulting from a difference in physical property values of materials between the multi-layer printed wiring board and the embedding-dedicated board built in internally to the multi-layer printed wiring board, during collective stacking of the multi-layer printed wiring board by thermal compression bonding and also due to changes over time. It is therefore possible for stable quality to be maintained over a long period.

In an embodiment of the electronic component built-in multi-layer wiring board, the embedding-dedicated board is formed by a plurality of insulating bases stacked therein, a wiring circuit connected to the first electronic component is formed on the insulating base, and the wiring circuit is formed on both surfaces of the embedding-dedicated board.

In another embodiment of the electronic component built-in multi-layer wiring board, the embedding-dedicated board is formed with the wiring circuit thereof having a narrower pitch than a circuit pitch of a wiring circuit of the printed wiring board.

In yet another embodiment of the electronic component built-in multi-layer wiring board, the embedding-dedicated board is formed by collectively stacking by thermal compression bonding.

A method of manufacturing an electronic component built-in multi-layer wiring board according to an embodiment of the present invention, the electronic component built-in multi-layer wiring board being configured by collectively stacking a plurality of printed wiring boards therein and the electronic component built-in multi-layer wiring board having a plurality of electronic components built in thereto, comprises the steps of: forming an embedding-dedicated board of multi-layer structure that has a first electronic component in the plurality of electronic components built in thereto and that is set to a thickness which is 80% to 125% of a thickness of a second electronic component, the thickness of the second electronic component being greater than that of the first electronic component; forming a first printed wiring board that has a first wiring circuit formed thereon, on which the embedding-dedicated board and the second electronic component are mounted; forming a second printed wiring board, the second printed wiring board having formed therein an opening in which the embedding-dedicated board and the second electronic component are to be housed, and the second printed wiring board having formed thereon a second wiring circuit which is connected to the first wiring circuit and having formed therein an interlayer connection-dedicated first via; aligning the second printed wiring board on the first printed wiring board to stack and perform provisional compression bonding thereof; inserting and mounting the embedding-dedicated board and the second electronic component in the opening; affixing a third printed wiring board on the second printed wiring board so as to cover over the opening, the third printed wiring board having formed thereon a third wiring circuit and having formed therein an interlayer connection-dedicated second via; and collectively stacking the first, second, and third printed wiring boards by thermal compression bonding, the embedding-dedicated board being formed by an identical material to that of the first through third printed wiring boards.

The method of manufacturing an electronic component built-in multi-layer wiring board according to the embodiment of the present invention results in the following, namely: forming beforehand an embedding-dedicated board that has a first electronic component built in thereto and that is set to a thickness which is 80% to 125% of a thickness of a second electronic component that has a thickness which is greater than that of the first electronic component; and, after mounting these on a second printed wiring board of a plurality of printed wiring boards that are stacked having formed therein an opening in which these are to be housed, collectively stacking the plurality of printed wiring boards by thermal compression bonding. Hence, there is no need to design accounting for different cavities, moreover mounting processes of the electronic components can also be standardized, thereby making it possible for the electronic component built-in multi-layer wiring board to be manufactured simply. In addition, as described above, the embedding-dedicated board and the printed wiring boards are formed by an identical material. It is therefore possible for stable quality to be maintained over a long period.

In an embodiment of the method of manufacturing an electronic component built-in multi-layer wiring board, the step of forming the embedding-dedicated board is a step of collectively stacking a plurality of insulating bases by thermal compression bonding, the plurality of insulating bases each having formed thereon a fourth wiring circuit connected to the first electronic component and the plurality of insulating bases having formed in a portion thereof an opening, the plurality of insulating bases being collectively stacked after housing the first electronic component in the opening.

In another embodiment of the method of manufacturing an electronic component built-in multi-layer wiring board, the embedding-dedicated board is formed by collectively stacking by thermal compression bonding.

DESCRIPTION OF THE PREFERRED EMBODIMENTS

Figure 1:
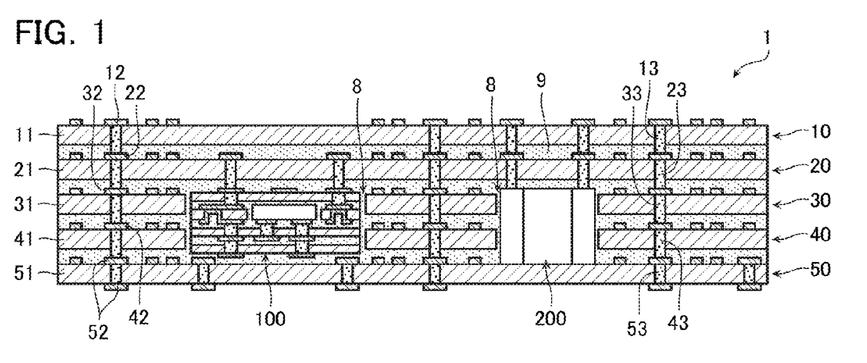
FIG. 1 is across-sectional view showing a structure of an electronic component built-in multi-layer wiring board formed by a method of manufacturing an electronic component built-in multi-layer wiring board according to an embodiment of the present invention.

An electronic component built-in multi-layer wiring board and a method of manufacturing the same according to embodiments of this invention will be described in detail below with reference to the accompanying drawings. FIG. 1 is a cross-sectional view showing a structure of an electronic component built-in multi-layer wiring board formed by a method of manufacturing an electronic component built-in multi-layer wiring board according to an embodiment of the present invention.

Figure 2:
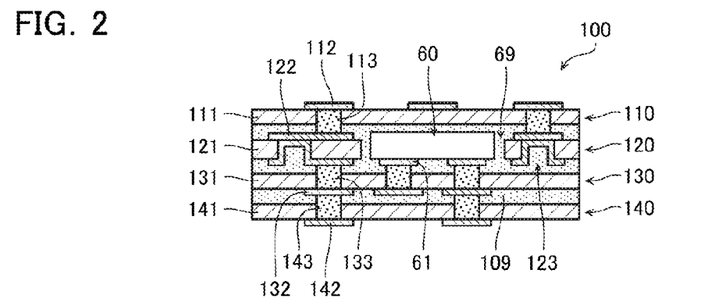
FIG. 2 is a cross-sectional view showing a structure of an embedding-dedicated board built in to the electronic component built-in multi-layer wiring board due to same method of manufacturing.
Figure 3:
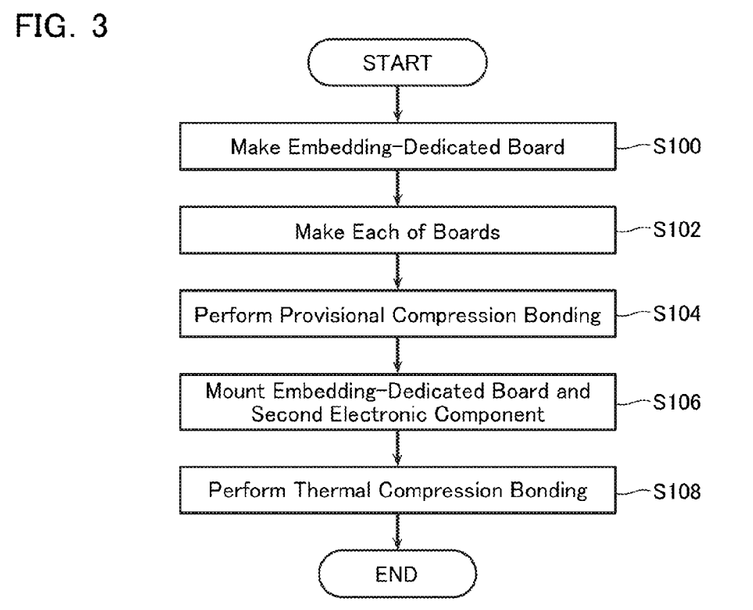
FIG. 3 is a flowchart showing a manufacturing process of the electronic component built-in multi-layer wiring board due to same method of manufacturing.
Figure 4:
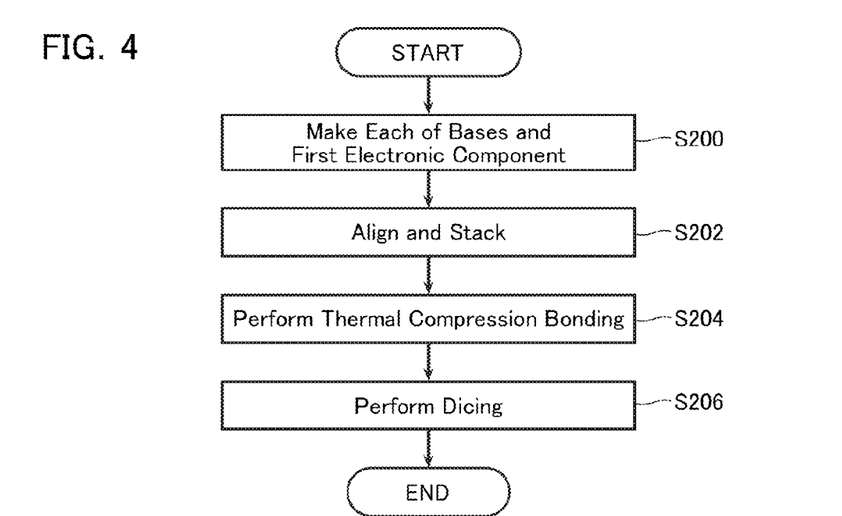
FIG. 4 is a flowchart showing a manufacturing process of the embedding-dedicated board in the manufacturing process of the electronic component built-in multi-layer wiring board due to same method of manufacturing.

Moreover, FIG. 2 is a cross-sectional view showing a structure of an embedding-dedicated board built in to the electronic component built-in multi-layer wiring board due to this method of manufacturing; FIG. 3 is a flowchart showing a manufacturing process of the electronic component built-in multi-layer wiring board due to this method of manufacturing; and FIG. 4 is a flowchart showing a manufacturing process of the embedding-dedicated board in the manufacturing process of the electronic component built-in multi-layer wiring board due to this method of manufacturing.

Figure 5A:
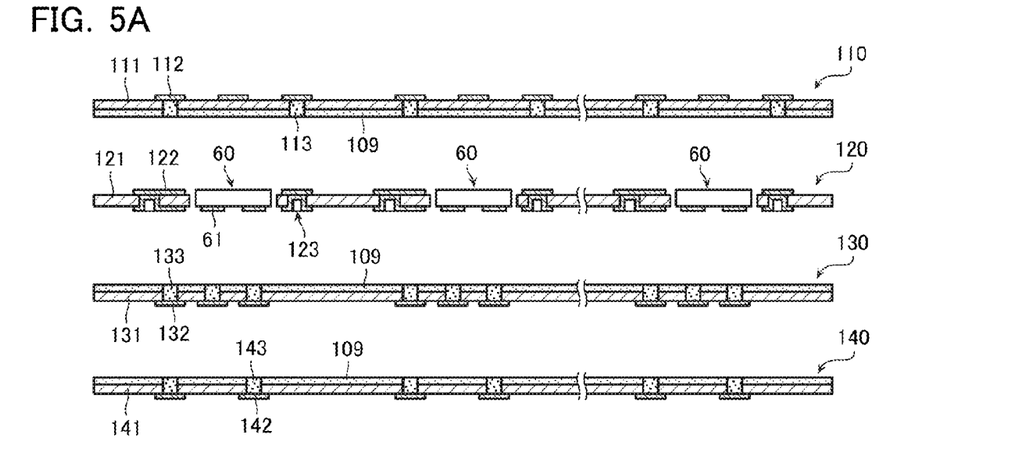
FIG. 5A is a cross-sectional view showing the embedding-dedicated board due to same method of manufacturing, on a manufacturing process basis.
Figure 5B:
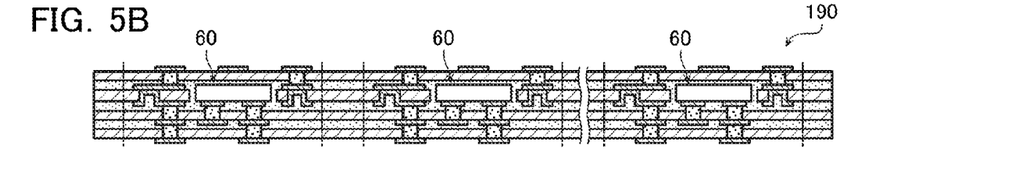
FIG. 5B is a cross-sectional view showing the embedding-dedicated board due to same method of manufacturing, on a manufacturing process basis.
Figure 5C:
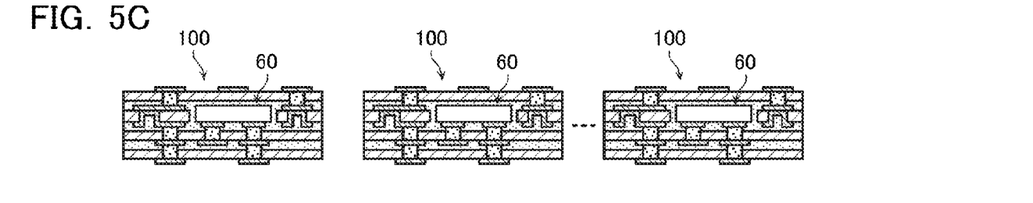
FIG. 5C is a cross-sectional view showing the embedding-dedicated board due to same method of manufacturing, on a manufacturing process basis.

Furthermore, FIGS. 5A, 5B, and 5C are each a cross-sectional view showing the embedding-dedicated board due to this method of manufacturing, on a manufacturing process basis; and FIGS. 6A, 6B, 6C, 6D, 6E, 6F, 6G, 6H, and 6I are each a cross-sectional view showing the electronic component built-in multi-layer wiring board due to this method of manufacturing, on a manufacturing process basis. An electronic component built-in multi-layer wiring board (abbreviated below to "multi-layer wiring board") 1 according to the present embodiment is a wiring board of a multi-layer structure that has, for example, a first electronic component and a second electronic component built in thereto as electronic components, the second electronic component having a thickness which is greater than that of the first electronic component.

As shown in FIG. 1, the multi-layer wiring board 1 comprises a structure in which a first printed wiring board 10, a second printed wiring board 20, a third printed wiring board 30, a fourth printed wiring board 40, and a fifth printed wiring board 50 are stacked collectively by thermal compression bonding.

The multi-layer wiring board 1 is configured having built in thereto an embedding-dedicated board 100 and a second electronic component 200 each disposed between the second and fifth printed wiring boards 20 and 50. The first through fourth printed wiring boards 10 to 40 are configured from, for example, a single-sided CCL (single-sided board), and the fifth printed wiring board 50 is configured from a double-sided CCL (double-sided board).

The first through fourth printed wiring boards 10 to 40 respectively comprise: first through fourth resin bases 11, 21, 31, and 41 which are each an insulating layer; and wiring circuits 12, 22, 32, and 42 that are each a wiring pattern, or the like, and are formed on one of surfaces (a single side) of these first through fourth resin bases 11, 21, 31, and 41. The fifth printed wiring board 50 comprises: a fifth resin base 51 which is an insulating layer; and wiring circuits 52 that are each a wiring pattern, or the like, and are respectively formed on both of surfaces (both sides) of this fifth resin base 51.

In addition, the first through fourth printed wiring boards 10 to 40 comprise: an adhesive layer 9 formed on an opposite side to a side of the wiring circuits 12 to 42 of each of the resin bases 11 to 41; and vias 13, 23, 33, and 43 that are for making interlayer connection between the wiring circuits 12 to 52 of each of the printed wiring boards 10 to 50 and that are formed by filling a conductive paste into a through-hole formed in each of the resin bases 11 to 41 and the adhesive layer 9. The adhesive layer 9 is configured from, for example, an adhesive agent of an epoxy system or an acrylic system, and so on, or an organic system adhesive agent including a volatile component, and so on.

The fifth printed wiring board 50 comprises a via 53 that connects between each of the wiring circuits 52 and that is formed by filling a conductive paste into a through-hole formed in the fifth resin base 51. Note that the via 53, in addition to having the above-described structure of a conductive paste filled into a through-hole, may be configured from, for example, an LVH plated via having a structure in which a plating is applied in a through-hole formed from a side of one of the wiring circuits 52 without penetrating the other of the wiring circuits 52, and may be formed by a copper plating.

In this case, a plating layer not illustrated is formed on the other of the wiring circuits 52. In addition, although omitted from FIG. 1, the via 53 may be configured by a plated through-hole having a structure in which a plating is applied in a through-hole that penetrates each of the wiring circuits 52.

The first through fifth resin bases 11 to 51 are each configured by, for example, a resin film. Employable as the resin film are, for example, a resin film configured from the likes of a polyimide, polyolefin, or liquid crystal polymer (LCP), or a resin film configured from a thermosetting epoxy resin, and so on.

The wiring circuits 12 to 52 are configured by, for example, pattern forming a conductive material such as copper foil. In addition, the conductive paste configuring the vias 13 to 53 includes, for example, at least one kind of metallic particle of low electrical resistance selected from the likes of nickel, gold, silver, copper, aluminum, andiron, and at least one kind of metallic particle of low melting point selected from the likes of tin, bismuth, indium, and lead. Moreover, the conductive paste configuring the vias 13 to 53 is configured from a paste having mixed into these metallic particles a binder component whose main component is an epoxy, an acrylic, a urethane, and so on.

Such a conductive paste enables the metal of low melting point contained therein to melt and form an alloy at a temperature of 200° C. or less. Specifically, the likes of copper or silver comprise characteristics allowing an intermetallic compound to be formed. Therefore, a connection between each of the vias 13 to 53 and the wiring circuits 12 to 52 is alloyed by an intermetallic compound during thermal compression bonding of collective stacking.

Note that the conductive paste may also be configured by a nanopaste in which, for example, a filler of the likes of gold, silver, copper, or nickel with a nano level particle diameter is mixed into a binder component of the above-described kind. In addition, the conductive paste may also be configured by a paste having metallic particles of the above-described nickel, and so on, mixed into a binder component of the above-described kind.

In this case, the conductive paste is characterized in that electrical connection is performed by contact between fellow metallic particles. Employable as a method of filling the conductive paste into the through-hole is, for example, a printing method, a spin coating method, a spray coating method, a dispensing method, a laminating method, a method combining use of these methods, and so on.

As shown in FIG. 2, the embedding-dedicated board 100 mounted on the fifth printed wiring board 50 comprises a structure in which a first wiring base 110, a second wiring base 120, a third wiring base 130, and a fourth wiring base 140 are stacked collectively by thermal compression bonding, similarly to in the above-described multi-layer wiring board 1. The embedding-dedicated board 100 is configured having built in thereto a first electronic component 60 disposed between the first and third wiring bases 110 and 130, and may be handled as a module component.

The first electronic component 60 is configured from, for example, a semiconductor element such as a transistor, an integrated circuit (IC), a diode, or the like. The first, third, and fourth wiring bases 110, 130, and 140 respectively comprise: first, third, and fourth insulating bases 111, 131, and 141 which are each an insulating layer; and wiring circuits 112, 132, and 142 that are each a wiring pattern, or the like, and are formed on one of surfaces of these first, third, and fourth insulating bases 111, 131, and 141. The second wiring base 120 comprises: a second insulating base 121 which is an insulating layer; and wiring circuits 122 that are each a wiring pattern, or the like, and are respectively formed on both of surfaces of this second insulating base 121.

The first, third, and fourth wiring bases 110 to 140 comprise: an adhesive layer 109 formed on an opposite side to a side of the wiring circuits 112 to 142 of each of the insulating bases 111 to 141; and vias 113, 133, and 143 that are for making interlayer connection between the wiring circuits 112 to 142 of each of the wiring bases 110 to 140 or a rewiring electrode 61 of the first electronic component 60 and that are formed by filling a conductive paste into a through-hole formed in each of the insulating bases 111 to 141 and the adhesive layer 109.

The second wiring base 120 comprises a via 123 that is for connecting between both surfaces of the second insulating base 121 and has a structure in which a copper plating, or the like, is applied in a through-hole formed from a side of one of the wiring circuits 122 without penetrating the other of the wiring circuits 122. Therefore, a plating layer not illustrated is formed on the other of the wiring circuits 122. In addition, the embedding-dedicated board 100 may be formed by a similar material to that of the multi-layer wiring board 1 or may be formed by a different material. The embedding-dedicated board 100 configured in this way may comprise the wiring circuits 112 and 142 on both surface sides thereof, hence enabling a higher density wiring design.

In addition, the second electronic component 200 mounted on the fifth printed wiring board 50 is configured from the likes of a resistor, a capacitor, a relay, and a piezoelectric element, and has its thickness formed greater compared to the first electronic component 60. For example, in the case where the thickness of the second electronic component 200 is about 300 μm and a thickness of the first electronic component 60 is about 150 μm, a difference in thickness of about 150 μm occurs when building in to the multi-layer wiring board 1.

Therefore, in the multi-layer wiring board 1 according to the present embodiment, the embedding-dedicated board 100 having the first electronic component 60 built in thereto and the second electronic component 200 are manufactured setting a thickness of the embedding-dedicated board 100 to be equal to the thickness of the second electronic component 200 and are mounted on a same printed wiring board of the multi-layer wiring board 1, whereby an excessive gap, and so on, is prevented from occurring in the multi-layer wiring board 1. Note that the thickness of the embedding-dedicated board 100 is set to about 80% to 125% of the thickness of the second electronic component 200, and a certain degree of error may be tolerated.

As a result of the multi-layer wiring board 1 being configured in this way, the first electronic component 60 and the second electronic component 200 of different thicknesses can be built in to the multi-layer wiring board 1 by a simple method. Moreover, the embedding-dedicated board 100 having its thickness aligned with the thickness of the second electronic component 200 can be manufactured beforehand, and a mounting device, or the like, can be employed to mount and build in the embedding-dedicated board 100 and the second electronic component 200, hence mounting processes of the electronic components can be standardized, thereby making it possible for the multi-layer wiring board 1 to be manufactured by a simple method.

Furthermore, the wiring circuit 112, and so on, of the embedding-dedicated board 100 is formed with a narrower pitch than the wiring circuit 12, and so on, of the multi-layer wiring board 1, and a wiring line can be laid to both surface sides of the embedding-dedicated board 100, thereby making it possible to form high density wiring in a periphery of the first electronic component 60 while suppressing an increase in thickness of the multi-layer wiring board 1 and the embedding-dedicated board 100.

Next, a method of manufacturing the multi-layer wiring board 1 according to the present embodiment will be described.

First, as shown in FIG. 3, the embedding-dedicated board 100 to be built in to the multi-layer wiring board 1 is made (step S100). Now, the embedding-dedicated board 100 is manufactured, for example, as follows. That is, as shown in FIG. 4, each of the bases configuring the embedding-dedicated board 100, and the first electronic component 60 to be built in to this embedding-dedicated board 100 are made (step S200).

Specifically, as shown in FIG. 5A, the first through fourth wiring bases 110 to 140 are made and the first electronic component 60 is made. A manufacturing process of the first wiring base 110, although omitted from the drawings, is, for example, as follows. First, a single-sided CCL (single-sided copper clad laminated board) in which a conductor layer configured from the likes of a solid-state copper foil is formed on one surface of the first insulating base 111, is prepared.

Next, an etching resist is formed on the conductor layer by photolithography, and then etching is performed to pattern form the wiring circuit 112. The single-sided CCL is configured from, for example, a structure in which the first insulating base 111 having a thickness of about 20 μm is affixed to the conductor layer configured from copper foil having a thickness of about 12 μm. Employable as the single-sided CCL is, for example, a single-sided CCL made by applying a varnish of polyimide to copper foil and hardening the varnish, by a publicly known casting method.

Otherwise employable as the single-sided CCL are the likes of a single-sided CCL in which a seed layer is formed on a polyimide film by sputtering and the conductor layer is formed by growing copper by plating, or a single-sided CCL made by attaching a rolled or electrolytic copper foil and a polyimide film by an adhesive material.

Note that a resin base of the first insulating base 111, and so on, is not necessarily required to be configured from a polyimide, and as described above, may be configured from a plastic film of a liquid crystal polymer, or the like. Moreover, an etchant whose main component is ferric chloride or cupric chloride may be employed in the etching.

Employable as the adhesive layer 109 is, for example, an epoxy system thermosetting resin having a thickness of about 25 μm that has been rendered in a semi-hardened state. The thermal compression bonding includes, for example, employing a vacuum laminator to press and attach these in a reduced pressure atmosphere, at a temperature at which the adhesive layer 109 does not harden.

Note that employable as the adhesive layer 109, and so on, are not only an epoxy system thermosetting resin, but also a prepreg in which an epoxy system thermosetting resin is coated on the likes of a glass fabric and rendered in a semi-hardened state, or various kinds of resins, and so on. The through-hole penetrating the adhesive layer 109 and the first insulating base 111 is formed at a certain place, and desmear processing is performed in the through-hole.

Now, the through-hole is formed at the certain place using, for example, a UV laser. The through-hole may otherwise be formed by the likes of a carbon dioxide laser or an excimer laser, or may be formed by the likes of drill processing or chemical etching. Moreover, the desmear processing can be performed by a mixed gas of $CF_4$ and $O_2$ (tetrafluoromethane+oxygen) in the case of plasma desmear, but may also employ another inert gas such as Ar (argon). Furthermore, the desmear processing may be configured as wet processing employing a chemical, rather than so-called dry processing.

When the through-hole has been formed, the above-described kind of conductive paste is filled into the through-hole by, for example, screen printing, or the like, to form the via 113, whereby the first wiring base 110 of the kind shown in FIG. 5A can be manufactured. The third and fourth wiring bases 130 and 140 may also be similarly manufactured by such processing, hence a description of processing in the case of these bases will be omitted here.

Next, a manufacturing process of the second wiring base 120, although omitted from the drawings, is, for example, as follows. First, a double-sided CCL (double-sided copper clad laminated board) in which a conductor layer configured from the likes of a solid-state copper foil is respectively formed on both surfaces of the second insulating base 121, is prepared. Then, the through-hole is formed at a certain place and desmear processing performed, and panel plate processing is performed on all surfaces of the second insulating base 121.

Subsequently, the wiring circuit 122 and the via 123, and so on, are pattern formed on both surfaces of the second insulating base 121 by etching, or the like, and the second insulating base 121 at a portion thereof where the first electronic component 60 is to be built in is removed by a UV laser, or the like, to form an opening 69, whereby the second wiring base 120 is manufactured. Note that the first electronic component 60 is manufactured, for example, as follows.

First, a pre-dicing wafer having an inorganic insulating layer formed therein, is prepared. Then, after the rewiring electrode 61, and so on, has been formed on a surface of the wafer and an insulating layer, and so on, has been formed, testing is performed and the wafer is formed into individual pieces by thinning and dicing, whereby the first electronic component 60 is manufactured. When each of the bases and the first electronic component 60 configuring the embedding-dedicated board 100 have been made in this way, these are aligned and stacked (step S202), and thermal compression bonding is performed (step S204).

As a result, an embedding-dedicated board parent member 190 having a plurality of the first electronic components 60 of the kind shown in FIG. 5B built in thereto, is manufactured. Finally, the embedding-dedicated board parent member 190 is diced by cutting at a certain interval (step S206), whereby a plurality of the embedding-dedicated boards 100 of the kind shown in FIG. 5C can be manufactured.

When the embedding-dedicated board 100 has been made in this way, each of the bases configuring the multi-layer wiring board 1 are made (step S102). Each of the bases can be made similarly to each of the bases in the embedding-dedicated board 100, hence a detailed description will be omitted here. However, the third printed wiring board 30 is manufactured, for example, as follows.

Figure 6A:
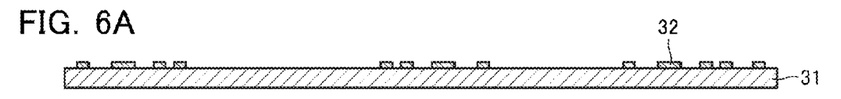
FIG. 6A is a cross-sectional view showing the electronic component built-in multi-layer wiring board due to same method of manufacturing, on a manufacturing process basis.
Figure 6B:
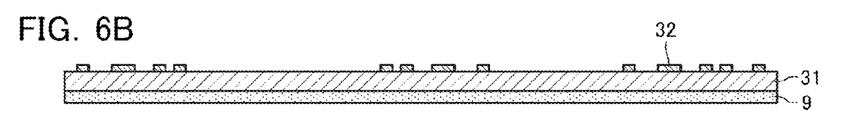
FIG. 6B is a cross-sectional view showing the electronic component built-in multi-layer wiring board due to same method of manufacturing, on a manufacturing process basis.

That is, as shown in FIG. 6A, the wiring circuit 32 is pattern formed on one surface of the third resin base 31, and then, as shown in FIG. 6B, the adhesive layer 9 is formed on a surface on an opposite side to the wiring circuit 32. Note that a thickness of the third resin base 31 is about 20 μm, and a thickness of the adhesive layer 9 is about 25 μm, hence a thickness of the third printed wiring board 30 is formed to about 45 μm. The other printed wiring boards are also formed to a similar thickness.

Figure 6C:
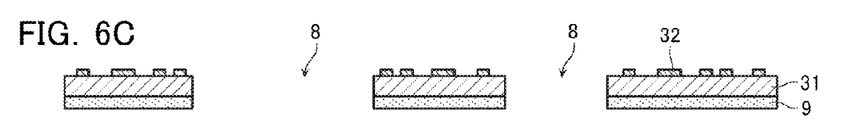
FIG. 6C is a cross-sectional view showing the electronic component built-in multi-layer wiring board due to same method of manufacturing, on a manufacturing process basis.
Figure 6D:
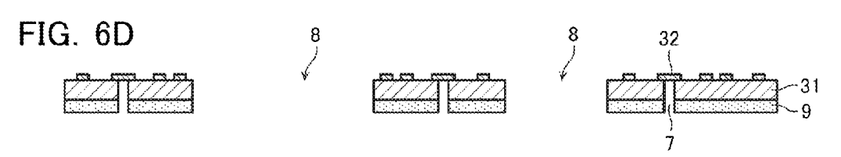
FIG. 6D is a cross-sectional view showing the electronic component built-in multi-layer wiring board due to same method of manufacturing, on a manufacturing process basis.
Figure 6E:
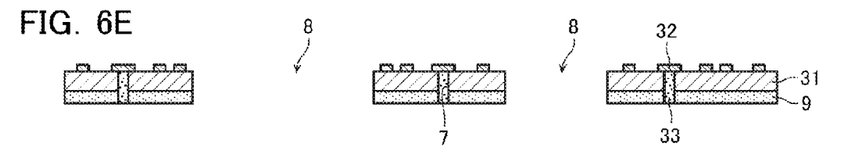
FIG. 6E is a cross-sectional view showing the electronic component built-in multi-layer wiring board due to same method of manufacturing, on a manufacturing process basis.
Figure 6F:
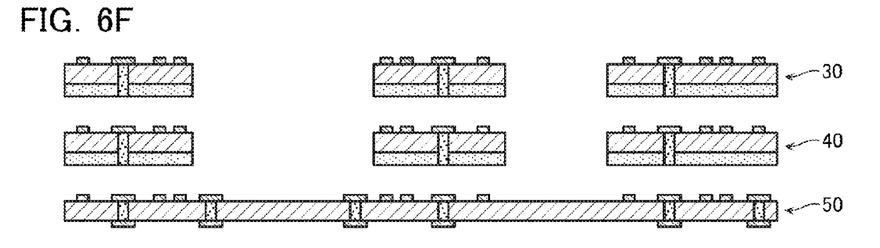
FIG. 6F is a cross-sectional view showing the electronic component built-in multi-layer wiring board due to same method of manufacturing, on a manufacturing process basis.
Figure 6G:
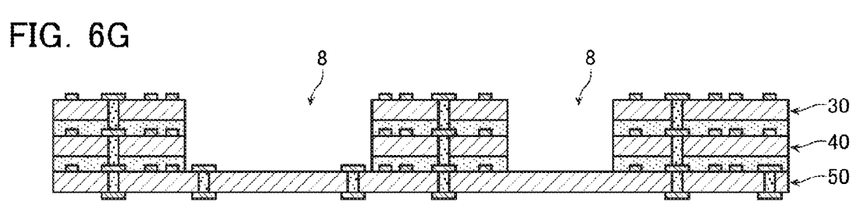
FIG. 6G is a cross-sectional view showing the electronic component built-in multi-layer wiring board due to same method of manufacturing, on a manufacturing process basis.

Next, as shown in FIG. 6C, an opening 8 is formed by a laser, or the like, at a certain place where the embedding-dedicated board 100 and the second electronic component 200 are to be housed, and, after a through-hole 7 has been formed from an adhesive layer 9 side as shown in FIG. 6D, the via 33 is formed by filling the conductive paste into the through-hole 7, whereby the third printed wiring board 30 of the kind shown in FIG. 6E is manufactured. When the fourth printed wiring board 40 has been similarly manufactured and the separately manufactured fifth printed wiring board 50 has been prepared, these are aligned and stacked as shown in FIG. 6F, and undergo provisional compression bonding by thermal compression bonding as shown in FIG. 6G (step S104).

Figure 6H:
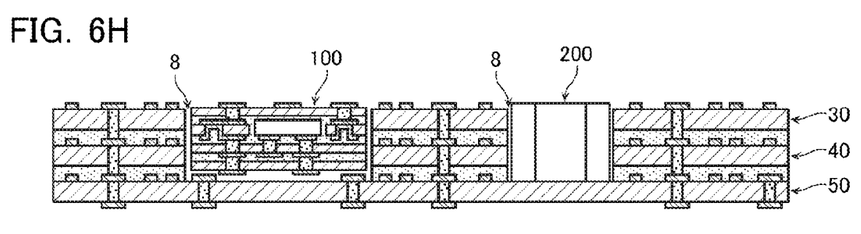
FIG. 6H is a cross-sectional view showing the electronic component built-in multi-layer wiring board due to same method of manufacturing, on a manufacturing process basis.
Figure 6I:
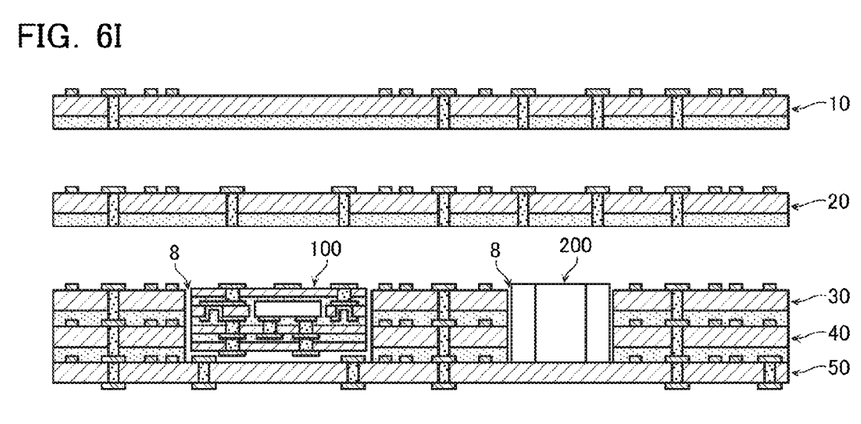
FIG. 6I is a cross-sectional view showing the electronic component built-in multi-layer wiring board due to same method of manufacturing, on a manufacturing process basis.

Then, as shown in FIG. 6H, the separately prepared embedding-dedicated board 100 and second electronic component 200 are inserted in the opening 8 to be mounted on the fifth printed wiring board 50 (step S106). Finally, as shown in FIG. 6I, the first and second printed wiring boards 10 and 20 are aligned to be stacked on the third printed wiring board 30, then thermal compression bonding is performed, whereby the multi-layer wiring board 1 according to the present embodiment of the kind shown in FIG. 1 is manufactured.

As described above, the electronic component built-in multi-layer wiring board and the method of manufacturing the same according to the present embodiment enable the first electronic component 60 and the second electronic component 200 having different thicknesses to be built in in a state where thicknesses of the components have been aligned, hence allowing the board to be manufactured by a simple method. In addition, the first electronic component 60 is first built in to the embedding-dedicated board 100 that has been aligned with the thickness of the second electronic component 200, and then built in to the board along with the second electronic component 200, hence handling is easy, a degree of freedom of wiring is high, and standardization of mounting processes can be achieved. Note that the embedding-dedicated board 100 is configured by a similar material to that of the multi-layer wiring board 1, but may be configured by a different material.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic component built-in multi-layer wiring board comprising:
   a plurality of printed wiring boards collectively stacked therein by thermal compression bonding; and
   a plurality of electronic components built in thereto, wherein
   the electronic components include a first electronic component and a second electronic component having a thickness which is greater than that of the first electronic component,
   the first electronic component is built in to an embedding-dedicated board set to a thickness which is 80% to 125% of the thickness of the second electronic component, and the embedding-dedicated board and the second electronic component are then mounted on the same one of the printed wiring boards and thereby built in to the electronic component built-in multi-layer wiring board,
   the plurality of printed wiring boards includes a top board, a bottom board and a middle board disposed between the top board and the bottom board, the middle board including a first cavity and a second cavity, the first cavity and the second cavity having the same height, the embedding-dedicated board being disposed in the first cavity and the second electronic component being disposed in the second cavity, and the embedding-dedicated board is formed by an identical material to that of the printed wiring boards.

2. The electronic component built-in multi-layer wiring board according to claim 1, wherein the embedding-dedicated board is formed by a plurality of insulating bases stacked therein, a wiring circuit connected to the first electronic component is formed on the insulating base, and the wiring circuit is formed on both surfaces of the embedding-dedicated board.

3. The electronic component built-in multi-layer wiring board according to claim 1, wherein the embedding-dedicated board is formed with the wiring circuit thereof having a narrower pitch than a circuit pitch of a wiring circuit of the printed wiring board.

4. The electronic component built-in multi-layer wiring board according to claim 1, wherein the embedding-dedicated board is formed by collectively stacking by thermal compression bonding.

\* \* \* \* \*